(12) United States Patent
Wang et al.

(10) Patent No.: US 10,352,982 B2
(45) Date of Patent: Jul. 16, 2019

(54) TESTING SYSTEM AND TESTING CIRCUIT THEREOF

(71) Applicant: CYBER POWER SYSTEMS, INC., Taipei (TW)

(72) Inventors: Yu-Sheng Wang, Taipei (TW); Hong-Lun Wang, Taipei (TW); Cheng-Yang Su, Taipei (TW)

(73) Assignee: CYBER POWER SYSTEMS, INC., Taipei, Taiwan (TW)

(*) Notice: Subject to any disclaimer, the term of this patent is extended or adjusted under 35 U.S.C. 154(b) by 14 days.

(21) Appl. No.: 15/639,277

(22) Filed: Jun. 30, 2017

(65) Prior Publication Data

US 2018/0335462 A1  Nov. 22, 2018

(30) Foreign Application Priority Data

May 19, 2017  (CN) .......................... 2017 1 0355469

(51) Int. Cl.
| | |
|---|---|
| *G01R 31/02* | (2006.01) |
| *G01R 31/04* | (2006.01) |
| *G08B 21/18* | (2006.01) |

(52) U.S. Cl.
CPC .......... *G01R 31/025* (2013.01); *G01R 31/04* (2013.01); *G08B 21/18* (2013.01)

(58) Field of Classification Search
CPC .... G01R 31/40; G01R 31/021; G01R 31/025; G01R 31/04; G08B 21/18; G09G 3/20; G09G 2330/02; G09G 2330/04; G09G 2330/006; H02J 7/022; H02J 7/027; H02J 7/045; H02M 3/335; H02M 3/33561; G06F 1/32

See application file for complete search history.

(56) References Cited

U.S. PATENT DOCUMENTS

| | | | | |
|---|---|---|---|---|
| 8,693,218 | B2* | 4/2014 | Chueh .............. | H02M 3/33507 363/21.15 |
| 2010/0067268 | A1* | 3/2010 | Kasprzak ............. | H02M 3/335 363/74 |
| 2011/0109322 | A1* | 5/2011 | Shi ....................... | H04N 17/04 324/555 |
| 2012/0182039 | A1* | 7/2012 | Partee ................... | G01R 31/40 324/764.01 |
| 2012/0268063 | A1* | 10/2012 | Qiu ....................... | H02J 7/022 320/107 |

\* cited by examiner

*Primary Examiner* — Thang X Le
(74) *Attorney, Agent, or Firm* — Bacon & Thomas, PLLC

(57) ABSTRACT

A testing system including an adapter and a testing circuit is provided. The adapter includes a converter having a first side and a second side, an inputting terminal and an outputting terminal. The testing circuit includes a testing switch having a first terminal and a second terminal, a detecting circuit and a first indicator. The first side is coupled to the inputting terminal. The second side is coupled to the outputting terminal. The converter is used to convert inputting power for providing outputting power to a load system. The first terminal is coupled to the outputting terminal. The detecting circuit is coupled to the second terminal. When the first terminal is couple with the outputting terminal and contacted with the second terminal, the detecting circuit is used to detect an outputting signal of converter for generating a detecting result. The first indicator sends a message according to the detecting result.

4 Claims, 1 Drawing Sheet

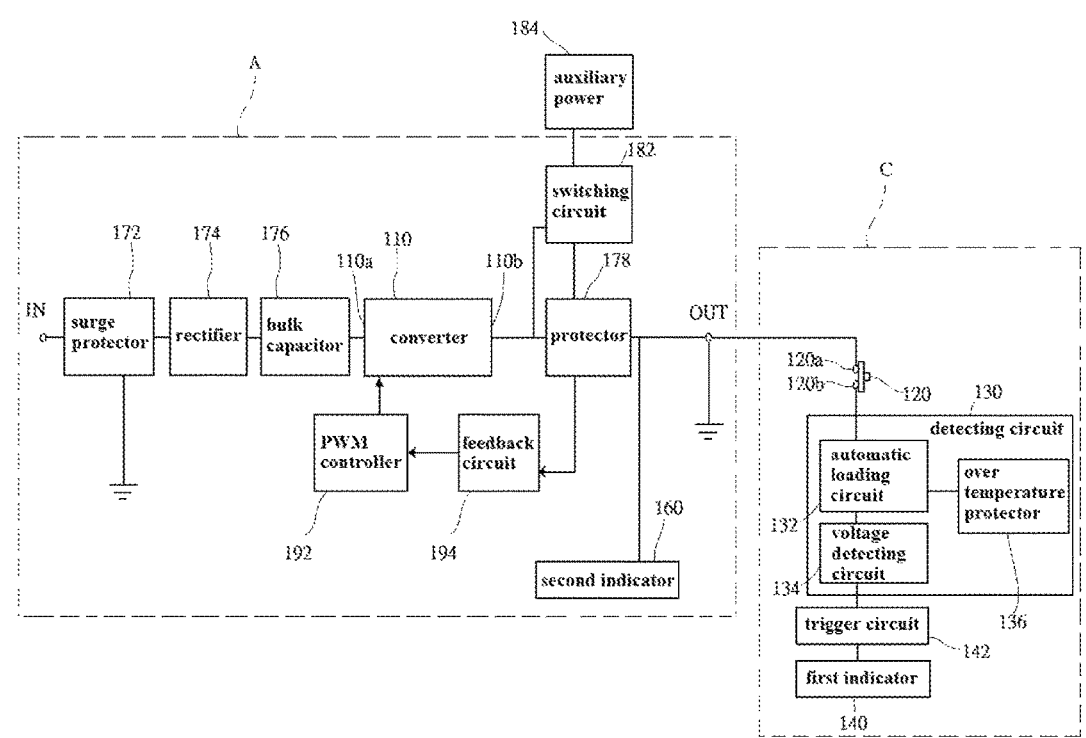

TESTING SYSTEM AND TESTING CIRCUIT THEREOF

BACKGROUND OF THE INVENTION

Field of the Invention

The present invention relates to a testing system and a testing circuit thereof, and more particularly, the present invention is relates to a testing system and a testing circuit thereof which being used for a adapter.

Description of Related Art

With the popularity of various types of electrical equipment, adapters are also widely used in various types of electrical equipment. However, the current detecting technology only provides the short-circuit detection of the circuit system in the adapter. The current detecting technology can not provide exhaustive electrical detection of the circuit system for determining fault states. Therefore, the required time for fault determining or troubleshooting increases significantly, and increases maintaining costs.

SUMMARY OF THE INVENTION

Accordingly, an object of the present invention is to provide a testing system and a testing circuit thereof for determining circuit state and fault state of the adapter quickly.

To achieve the foregoing and other objects, a testing circuit is provided. The testing circuit is used to couple with a adapter for testing through external connection. Wherein, the adapter has an inputting terminal used for receiving an inputting power, an outputting terminal used for providing an outputting power to a load system, and a converter. The converter has a first side and a second side. The first side is coupled to the inputting terminal electrically, and the second side and the outputting terminal are coupled electrically. The converter converts the inputting power for providing the outputting power to the load system.

From above, the testing circuit includes a testing switch, a detecting circuit, and a first indicator. The testing switch has a first terminal and a second terminal. The first terminal is suitable for coupling with the outputting terminal electrically. The second terminal and the detecting circuit are coupled electrically. The testing switch is switched between a conductive state and a disconnected state. Wherein, when the first terminal of the testing switch and the outputting terminal are coupled electrically and the first terminal and the second terminal of the testing switch are conductive, the detecting circuit detects a signal outputted form the second side of the converter for generating a detecting result, and the first indicator sends a message according to the detecting result.

In one embodiment of the present invention, one of the testing switch and the load system is coupled to the outputting terminal electrically.

In one embodiment of the present invention, the detecting circuit includes a automatic loading circuit and a voltage detecting circuit. The automatic loading circuit is coupled to the second terminal of the testing switch electrically. The voltage detecting circuit is coupled to the automatic loading circuit electrically for detecting voltage range of the second side of the converter to generate the detecting result, and sends the detecting result to the first indicator.

In one embodiment of the present invention, when the first terminal and the second terminal of the testing switch are conductive, the automatic loading circuit outputs a load, and the voltage detecting circuit detects voltage range of the second side of the converter for generating the detecting result.

In one embodiment of the present invention, the detecting circuit further comprising an over temperature protector, coupled to the automatic loading circuit electrically.

To achieve the foregoing and other objects, a testing system having the foregoing adapter and testing circuit is further provided for determining circuit state and fault state of the adapter quickly.

BRIEF DESCRIPTION OF THE DRAWINGS

Other features and advantages of the present invention will become apparent in the following detailed description of the preferred embodiments with reference to the accompanying drawings, of which:

FIG. 1 is a schematic view illustrating a testing system according to one embodiment of the present invention.

DESCRIPTION OF EMBODIMENTS

The characteristics, contents, advantages and achieved effects of the present disclosure will become more fully understood from the detailed description given herein below and the accompanying drawings which are given by way of illustration only, and thus are not limitative of the present disclosure.

As required, detailed embodiments are disclosed herein. It must be understood that the disclosed embodiments are merely exemplary of and may be embodied in various and alternative forms, and combinations thereof. As used herein, the word "exemplary" is used expansively to refer to embodiments that serve as illustrations, specimens, models, or patterns. The figures are not necessarily to scale and some features may be exaggerated or minimized to show details of particular components. In other instances, well-known components, systems, materials, or methods that are known to those having ordinary skill in the art have not been described in detail in order to avoid obscuring the present disclosure. Therefore, specific structural and functional details disclosed herein are not to be interpreted as limiting, but merely as a basis for the claims and as a representative basis for teaching one skilled in the art.

FIG. 1 is a schematic view illustrating a testing system according to one embodiment of the present invention. Referring to FIG. 1, a testing system 100 of the present embodiment includes a adapter A and a testing circuit C. The adapter A includes an inputting terminal IN, an outputting terminal OUT and a converter 110 mainly. The inputting terminal IN is suitable for receiving an inputting power. The inputting power is, for example, a utility power. The outputting terminal OUT is suitable for providing an outputting power to a load system (not shown). The load system is, for example, network device or other electrical devices. In addition, the converter 110 of the present embodiment is coupled between the inputting terminal IN and the outputting terminal OUT electrically. The inputting power can be converted by the converter 110 for providing the outputting power to the load system. Besides, the converter 110 of the present embodiment can be a transformer, an isolated transformer or an isolated converter.

From above, the converter 110 of the present embodiment has a first side 110a and a second side 110b, for example.

The first side 110a of the converter 110 is coupled to the inputting terminal IN electrically. The second side 110b of the converter 110 is coupled to the outputting terminal OUT electrically. Wherein, when the converter 110 is, for example, a transformer, the first side 110a of the converter 110 is, for example, configured with a auxiliary winding, and the second side 110b of the converter 110 is configured with at least one output winding. In the present embodiment, the inputting voltage can be converted by the converter 110 for the providing the outputting voltage to the load system.

In addition, the testing circuit C of the present embodiment is coupled to the adapter A through external connection. In the present embodiment, the testing circuit C includes a testing switch 120, a detecting circuit 130 and a first indicator 140. One of the testing switch 120 and the load system is, for example, coupled to the outputting terminal OUT electrically. Further, the testing switch 120 of the present embodiment has a first terminal 120a and a second terminal 120b. Wherein, the first terminal 120a of the testing switch 120 is suitable to couple with the outputting terminal OUT electrically, and the detecting circuit 130 is coupled to the second terminal 120b of the testing switch 120 electrically.

Worth mention, in the present embodiment, at least portion of the foregoing testing switch 120 is, for example, exposed out of body of the testing circuit C. Therefore, when the testing circuit C is coupled to the adapter A electrically through external connection and the testing switch 120 is pressed, the first terminal 120a and the second terminal 120b of the testing switch 120 can be conductive. Meantime, the load is actuated by the detecting circuit 130 so that the detecting circuit 130 can detects the signal outputted form the second side 110b of the converter 110 to generate a detecting result. Then, the first indicator 140 will sends a message according to detecting result. Thus, the testing system 100 of the present embodiment can determine circuit state or fault state of the adapter quickly according to message type send by the first indicator 140.

Further, the detecting circuit 130 of the present embodiment includes, for example, a automatic loading circuit 132 and a voltage detecting circuit 134. Wherein, the automatic loading circuit 132 is coupled to the second terminal 120b of the testing switch 120 electrically, and the voltage detecting circuit 134 is coupled to the automatic loading circuit 132 electrically. In the present embodiment, the voltage detecting circuit 134 is used to detect voltage range outputted from the second side 110b of the converter 110. Therefore, when the first terminal 120a and the second terminal 120b of the testing switch 120 are conducted, the automatic loading circuit 132 will output the load, and the voltage detecting circuit 134 will detect voltage range at the second side 110b of the converter 110 for generating the foregoing detecting result. Then, the detecting result can be transmitted to the first indicator 140. In addition, the detecting circuit 130 of the present embodiment further includes a over temperature protector 136. The over temperature protector 136 of the present embodiment is coupled to the automatic loading circuit 132 electrically for providing an over temperature protecting mechanism.

In a preferred embodiment, the first indicator 140 is, for example, light indicator, and the detecting result can be the outputting voltage range at second side 110b of the converter 110. Thus, the first indicator 140 can indicate whether the voltage range at second side 110b of the converter 110 is maintained in a standard range by emitting different colors or different flicker frequency lights. In other words, the testing circuit C of the present embodiment can provides the circuit working state of adapter A to users for determining the circuit state or fault state of adapter A quickly.

In detail, when the detecting result is the outputting voltage range at the second side 110b of the converter 110 and the outputting voltage range is maintained in the standard range, the light indicator can emits lights with a first color. When the detecting result is the outputting voltage range at the second side 110b of the converter 110 and the outputting voltage range is out of the standard range, the light indicator can emits lights with a second color. Wherein, the first color is, for example, green. The second color is, for example, red for being a warning message obviously.

In addition, when the testing switch 120 is pressed to conduct the first terminal 120a and the second terminal 120b of the testing switch 120 and the first indicator 140 is not actuated, this means that a short circuit or other fault condition may be occurred in adapter A so that the first indicator 140 is not powered. In other words, when the first indicator 140 is, for example, light indicator, and the testing switch 120 is conductive and no light is emitted from the light indicator, a short circuit or other fault condition may be occurred in the circuit of adapter A. On the other hand, if the light indicator emits green light, the circuit of adapter A is in normal state. Relatively, if the light indicator emits red light, the outputting voltage range of the converter 110 in adapter A is out of the standard range, which means that the circuit of adapter A is in fault condition.

The foregoing first indicator 140 is the light indicator, for example. In other embodiments, the first indicator 140 also can be a sound indicator or other suitable indicators. Similarly, fault styles or circuit states of adapter A also can be determined quickly by different types of sound sources. In addition, in the present embodiment, the first indicator 140 is, for example, triggered by a trigger circuit 142 coupled between the first indicator 140 and the voltage detecting circuit 134 electrically for performing the instructions.

Besides, the testing switch 120 of the present embodiment is, for example, switched between a conductive state and a disconnected state. In detail, the conductive state of the testing switch 120 is, for example, the state that the first terminal 120a of the testing switch 120 is coupled to the second terminal 120b of the testing switch 120 electrically. Relatively, the disconnected state of the testing switch 120 is, for example, the state that the first terminal 120a of the testing switch 120 is not coupled to the second terminal 120b of the testing switch 120 electrically. Further, because at least portion of the testing switch 120 in the present embodiment is, for example, exposed out of body of the testing circuit C. Therefore, when the adapter A is required to test, the testing circuit C can be coupled to adapter A electrically through external connection, and then presses the testing switch 120 exposed out of body of the testing circuit C. Thus, the first terminal 120a of the testing switch 120 can be coupled to the second terminal 120b of the testing switch 120 electrically for being the conductive state. On the contrary, when the testing circuit C still be coupled to adapter A electrically through external connection, but the testing switch 120 exposed out of body of adapter is still not pressed, the first terminal 120a of the testing switch 120 is not coupled to the second terminal 120b of the testing switch 120 electrically, the testing switch 120 is in the disconnected state.

Further, when the first terminal 120a and the second terminal 120b of the testing switch 120 are conductive, the automatic loading circuit 132 of the detecting circuit 130 will outputs the load, and the outputting signal at the second side 110b of the converter 110 will be detected by the voltage detecting circuit 134 of the detecting circuit 130 for generating the foregoing detecting result. Thereafter, the first indicator 140 will sends the message according to the detecting result. In detail, when the first terminal 120a and the second terminal 120b of the testing switch 120 are conductive, the automatic loading circuit 132 will outputs loads with various degrees, and the voltage detecting circuit 134 will detects whether the outputting voltage range of the second side 110b in the converter 110 is maintained in the standard range by applying various loading degrees.

In a preferred embodiment, the testing circuit of the adapter 100 also includes a second indicator 160. The second indicator 160 of the present embodiment is, for example, coupled to the second side 110b of the converter 110 electrically. When the testing circuit C is coupled to adapter A electrically through external connection, the second indicator 160 and the testing switch 120 are, for example, coupled to the second side 110b of the converter 110 in parallel. On the other hand, the second indicator 160 can indicate whether the outputting terminal OUT is in normal state of power supply for operator's reference. The same as above, when the second indicator 160 is, for example, a light indicator. When no light is emitted from the light indicator, a short circuit or other fault condition may be occurred in the circuit of adapter A.

In short, in the present embodiment, the second indicator 160 is, for example, only used for references of power supply status, short circuit or other fault conditions of adapter A. In addition, the first indicator 140 of the testing circuit C is used to indicate whether the outputting voltage range of the converter 110 is maintained in the standard range. In other words, the present embodiment indicates various fault conditions quickly to determine circuit state or other fault states of adapter A by multiple indicators respectively. Certainly, in the state of being configured with multiple indicators, pressing switchers (not shown) can disposed in body of adapter A or in body of the testing circuit C for testing.

In a preferred embodiment, the testing circuit of the adapter 100 can includes a surge protector 172, a rectifier 174 and a bulk capacitor 176. The rectifier 174 is, for example, a diode bridge. The foregoing surge protector, rectifier and the bulk capacitor are, for example, coupled to the first side 110a of the converter 110 in series. In addition, the adapter A further includes a protector 178. The protector 178 is, for example, coupled between the second side 110b of the converter 110 and the testing switch 120 electrically. The protector 178 is an over-voltage protector, an over-current protector or a short circuit protector.

In a preferred embodiment, the adapter A can includes a switching circuit 182. One terminal of the switching circuit 182 is coupled to the second side 110b of the converter 110 electrically, and another terminal of the switching circuit 182 is coupled to a auxiliary power 184. In the present embodiment, the switching circuit 182 can detect the output at the second side of converter 110 for controlling the electrical discharge of the auxiliary power 184. This means, when no any inputting power is received by the inputting terminal IN, the switching circuit 182 can detect that no any outputting power is outputted at the second side of the converter 110. Therefore, the switching circuit 182 can control the auxiliary power 184 to perform the electrical discharge for providing the work of the load system.

In a preferred embodiment, the adapter A further includes a PWM controller 192 and a feedback circuit 194. In the present embodiment, one terminal of the PWM controller 192 is coupled to the first side 110a of the converter 110 electrically, and another terminal of the PWM controller 192 is coupled to the feedback circuit 194. On the other hand, the feedback circuit 194 is coupled between the second side 110b of the converter 110 and the PWM controller 192 electrically. Thus, the PWM controller 192 can detect output of the feedback circuit for controlling the first side 110a of the converter 110 and adjusting the power transmitted to the converter 110 through the inputting terminal IN.

In a preferred embodiment, the converter 110 can be a transformer, an isolated converter, an isolated transformer, a non-isolated converter or a non-isolated transformer.

To sum up, in the present invention, a testing system is applied to determine circuit state or fault state of adapter quickly. In detail, the testing circuit of the present invention is coupled to adapter for testing through external connection. Wherein, the testing switch of the testing circuit is, for example, exposed out of body of the testing circuit. Therefore, when the testing switch is pressed to conduct two terminals of the testing switch for detecting outputting signal of the converter to generating a detecting result, the indicator can sends a message according to the detecting result. Thus, in the present invention, the testing circuit can determine circuit state or fault state of adapter quickly according to message type send by the indicator.

In other words, because the testing circuit of the present invention can be coupled to body of adapter conveniently through external connection, so that users can perform the self-test for the adapter to understand the health status of the adapter circuit. On the other hand, when users can perform the self-test to determine the circuit state or fault state of the adapter, maintaining costs can be reduced significantly. Besides, the required time for fault determining or troubleshooting can reduces significantly.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A testing circuit coupled to an adapter for testing through external connection, wherein the adapter has an inputting terminal used for receiving an inputting power, an outputting terminal used for providing an outputting power to a load system, and a converter, the converter has a first side and a second side, the first side is electrically coupled to the inputting terminal, the second side is electrically coupled to the outputting terminal, and the converter converts the inputting power for providing the outputting power to the load system, the testing circuit comprising:

a testing switch having a first terminal and a second terminal, the first terminal being electrically coupled to the outputting terminal, and the testing switch being switched between a conductive state and a disconnected state;

a first indicator; and a detecting circuit electrically coupled to the second terminal of the testing switch, the detecting circuit including:

an automatic loading circuit electrically coupled to the second terminal of the testing switch, and a voltage detecting circuit electrically coupled to the automatic loading circuit and the first indicator;

wherein when the first terminal is electrically coupled to the outputting terminal and the first terminal and the second terminal are conductive, the automatic loading circuit outputs loads with various degrees, and the voltage detecting circuit determines whether an outputting voltage range of the second side is maintained in a predetermined range, thereby generating a detecting result for enabling the first indicator to send a message according to the detecting result.

2. The testing circuit according to claim 1, wherein the detecting circuit further comprises an over temperature protector electrically coupled to the automatic loading circuit.

3. A testing system, comprising:
an adapter having an inputting terminal used for receiving an inputting power, an outputting terminal used for providing an outputting power to a load system, and a converter, wherein the converter has a first side and a second side, the first side is electrically coupled to the inputting terminal, the second side is electrically coupled to the outputting terminal, and the converter converts the inputting power for providing the outputting power to the load system; and
a testing circuit coupled to the adapter through an external connection, the testing circuit including:
a testing switch having a first terminal and a second terminal, the first terminal being electrically coupled to the outputting terminal, and the testing circuit being switched between a conductive state and a disconnected state;
a first indicator; and
a detecting circuit electrically coupled to the second terminal of the testing switch, the detecting circuit including:
an automatic locating circuit electrically coupled to the second terminal of the testing switch; and
a voltage detecting circuit electrically coupled to the automatic loading circuit and the first indicator,
wherein when the first terminal is electrically coupled to the outputting terminal and the first terminal and the second terminal are conductive, the automatic loading circuit outputs loads with various degrees, and the voltage detecting circuit determines whether an outputting voltage range of the second side is maintained in a predetermined range, thereby generating a detecting result for enabling the first indicator to send a message according to the detecting result.

4. The testing system according to claim 3, wherein the detecting circuit further comprising an over temperature protector electrically coupled to the automatic loading circuit.

* * * * *